United States Patent
Park et al.

(10) Patent No.: US 11,575,106 B2
(45) Date of Patent: Feb. 7, 2023

(54) TRANSPARENT DISPLAY DEVICE EFFECTIVELY SUPPRESSING MISALIGNMENT IN BONDING SUBSTRATES

(71) Applicant: LG Display Co., Ltd., Seoul (KR)

(72) Inventors: Sunghee Park, Goyang-si (KR); Joonsoo Han, Goyang-si (KR); Sunyoung Park, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 62 days.

(21) Appl. No.: 17/010,209

(22) Filed: Sep. 2, 2020

(65) Prior Publication Data
US 2021/0091333 A1    Mar. 25, 2021

(30) Foreign Application Priority Data
Sep. 23, 2019  (KR) .................... 10-2019-0116763

(51) Int. Cl.
*H01L 51/52*  (2006.01)
*H01L 27/32*  (2006.01)

(52) U.S. Cl.
CPC ........ *H01L 51/525* (2013.01); *H01L 27/3246* (2013.01); *H01L 27/3258* (2013.01); *H01L 51/5246* (2013.01); *H01L 27/322* (2013.01); *H01L 27/3213* (2013.01)

(58) Field of Classification Search
CPC ............ H01L 51/525; H01L 27/3246; H01L 27/3258; H01L 51/5246; H01L 27/322
USPC .......................................................... 257/40
See application file for complete search history.

(56) References Cited

U.S. PATENT DOCUMENTS

| | | | |
|---|---|---|---|
| 2014/0183458 A1* | 7/2014 | Lee ..................... | H01L 51/5246 438/46 |
| 2016/0276620 A1* | 9/2016 | Hong .................. | H01L 51/5243 |
| 2020/0273927 A1* | 8/2020 | Oh ........................ | H01L 27/326 |
| 2021/0066410 A1* | 3/2021 | Jo ........................ | H01L 27/3234 |
| 2021/0296418 A1* | 9/2021 | Park ..................... | H01L 51/5253 |
| 2021/0408492 A1* | 12/2021 | Ouyang .............. | H01L 27/3234 |

FOREIGN PATENT DOCUMENTS

| | | |
|---|---|---|
| KR | 10-2006-0097924 A | 9/2006 |
| KR | 10-0730196 B | 6/2007 |
| KR | 10-2008-0101112 A | 11/2008 |
| KR | 10-2009-0129144 A | 12/2009 |
| KR | 10-2010-0000408 A | 1/2010 |
| KR | 10-2014-0028390 A | 3/2014 |
| KR | 10-2014-0082092 A | 7/2014 |
| KR | 10-2016-0062661 A | 6/2016 |
| KR | 10-2017-0027362 A | 3/2017 |
| KR | 10-2017-0112151 A | 10/2017 |

* cited by examiner

*Primary Examiner* — Xia L Cross
(74) *Attorney, Agent, or Firm* — Polsinelli PC

(57) ABSTRACT

A transparent display device includes a display panel including first areas which are emission areas and second areas which are transmission areas, the display panel includes a first substrate and a second substrate facing each other, the first substrate includes an insulating layer having an open hole that is prepared by removing the insulating layer by at least a partial thickness in the second area, and the second substrate includes a transparent spacer located in the second area and pulled into the open hole.

20 Claims, 15 Drawing Sheets

TRANSPARENT DISPLAY DEVICE EFFECTIVELY SUPPRESSING MISALIGNMENT IN BONDING SUBSTRATES

CROSS-REFERENCE TO RELATED APPLICATION

This application claims the priority of Korean Patent Application No. 10-2019-0116763 filed on Sep. 23, 2019, which is hereby incorporated by reference in its entirety.

BACKGROUND

Field of the Disclosure

The present disclosure relates to a transparent display device.

Description of the Background

Various display devices that are less bulky and lighter than cathode ray tubes are being developed. Examples of the display devices include a liquid crystal display (LCD), a field emission display (FED), a plasma display panel (PDP), an organic light emitting display device (OLED), etc.

Among these flat panel display devices, an OLED is a self-emission display device configured to emit light by exciting organic compounds. In contrast to an LCD, the OLED does not require a backlight. Thus, the OLED has advantages of a thin profile, lightness in weight, and a simpler manufacturing process. Also, the OLED has been widely used because it can be manufactured at low temperatures, has a fast response time of 1 ms or less, and features low power consumption, wide viewing angle, and high contrast.

The OLED includes an organic light emitting diode that converts electric energy into light energy. The organic light emitting diode includes an anode, a cathode, and an organic emission layer disposed between the anode and the cathode. Holes and electrons are injected from the anode and cathode, respectively, and recombined in the emission layer to form excitons, whereby the OLED displays an image by emitting light when the formed excitons fall from the excited state to the ground state.

Recently, studies on transparent display devices have been actively carried out. A transparent display device refers to a display device that enables a user in front of a display panel to recognize visual information displayed on the display panel and objects located on the rear surface of the display panel. To this end, the transparent display device includes an emission area where driving elements are disposed to display input images, and a transmission area which transmits external light.

SUMMARY

The present disclosure provides a transparent display device which is easy to align.

According to an aspect of the present disclosure, a transparent display device includes: a display panel including first areas which are emission areas and second areas which are transmission areas. The display panel includes a first substrate and a second substrate facing each other. The first substrate includes an insulating layer having an open hole that is prepared by removing the insulating layer by at least a partial thickness in the second area. The second substrate includes a transparent spacer located in the second area and pulled into the open hole.

A cross section of the transparent spacer may include a first top side in contact with the second substrate and a first bottom side facing the first top side. Also, the cross section of the transparent spacer may include a first right side connecting one side of the first top side and one side of the first bottom side and a first left side connecting the other side of the first top side and the other side of the first bottom side. A cross section of the open hole may include a second bottom side facing the first bottom side and a second right side extended from one end of the second bottom side and facing the first right side. Also, the cross section of the open hole may include a second left side extended from the other end of the second bottom side and facing the first left side.

An internal angle between the first bottom side and the first right side may be a right angle or obtuse angle. Also, an internal angle between the second bottom side and the second right side may correspond to the internal angle between the first bottom side and the first right side.

An internal angle between the first bottom side and the first left side may be a right angle or obtuse angle. Also, an internal angle between the second bottom side and the second left side may correspond to the internal angle between the first bottom side and the first left side.

The first areas may include a first sub-area and a second sub-area located adjacent to each other with the second area interposed therebetween. The first substrate may include a first electrode which may include a first sub-electrode disposed only in the first sub-area and a second sub-electrode disposed only in the second sub-area. The first substrate may also include an organic emission layer covering the first sub-electrode and the second sub-electrode and disposed and extended on the second sub-area, the second areas and the third sub-area. The first substrate may further include a second electrode covering the organic emission layer and disposed and extended on the second sub-area, the second areas and third sub-area.

A part of the organic emission layer and a part of the second electrode may remain inside the open hole.

The open hole may penetrate the insulating layer and, and a part of the organic emission layer and a part of the second electrode may remain inside the open hole.

The open hole may penetrate the insulating layer and, and the organic emission layer and the second electrode may be removed from the inside of the open hole and the first substrate may be exposed.

The transparent spacer may be in direct contact with the first substrate inside the open hole.

The display panel may include pixels disposed in the first areas, and the transparent spacer may be located between each pair of the pixels adjacent to each other.

The display panel may include pixels disposed in the first areas, and the transparent spacer may be located between the pixels adjacent to each other selectively only in a predetermined area.

The display panel may include pixels disposed in the first areas, and the transparent spacer may be located and extended as one body between a plurality of pairs of the pixels adjacent to each other.

The transparent spacer may contain frit powder.

The transparent display device may further include a dam located on the edges of the first substrate and the second substrate, and the dam may contain frit powder.

According to the present disclosure, a transmission area is provided outside an emission area. Therefore, it is possible to provide a transparent display device.

According to the present disclosure, a combination of a transparent spacer with an open hole makes it possible to minimize a misalignment problem which may occur when a first substrate and a second substrate are bonded to each other.

According to the present disclosure, the transparent spacer makes it possible to stably maintain a cell gap between the first substrate and the second substrate. Therefore, a filler layer for maintaining a cell gap between the first substrate and the second substrate can be omitted. Thus, it is possible to suppress element degradation caused by outgassing which may occur when a filler layer is formed.

According to the present disclosure, the transparent spacer makes it possible to suppress sagging of the second substrate in a processing environment and/or usage environment. Therefore, it is possible to suppress the degradation in optical properties caused by the shape deformation of the second substrate.

According to the present disclosure, the transparent spacer having a predetermined transmittance is disposed in the transmission area, and, thus, there is no need to assign a separate space for forming a spacer. Therefore, it is possible to secure a transmission area and also possible to improve the degree of design freedom.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
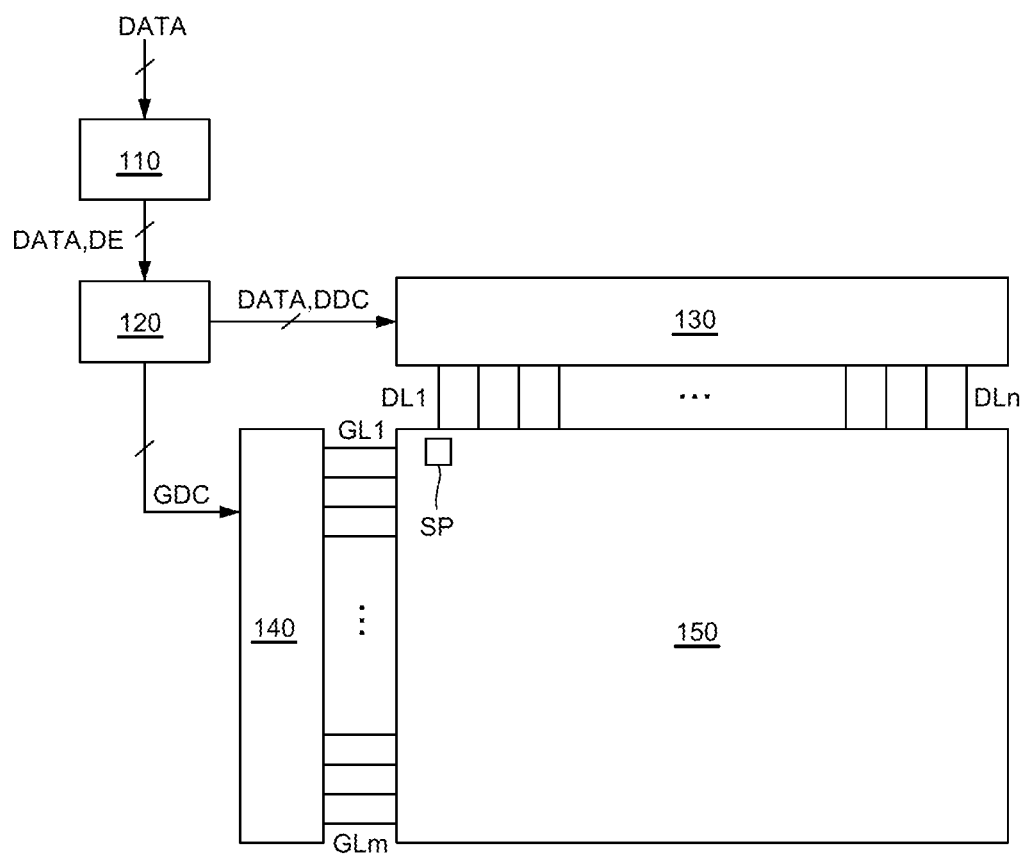
FIG. 1 is a schematic block diagram of a transparent display device.

Hereinafter, aspects of the present disclosure will be described with reference to the accompanying drawings. Throughout the whole specification, the same reference numerals denote substantially the same elements. Further, in the following description, a detailed explanation of known technologies or configurations related to the present disclosure may be omitted to avoid unnecessarily obscuring the subject matter of the present disclosure. In the following aspects, the same components are described in a first aspect and description of such components may be omitted in the other aspects.

The terms "first," "second," etc. may be used to describe various components, but the components are not limited by such terms. The terms are used only for the purpose of distinguishing one component from other components.

Figure 2:
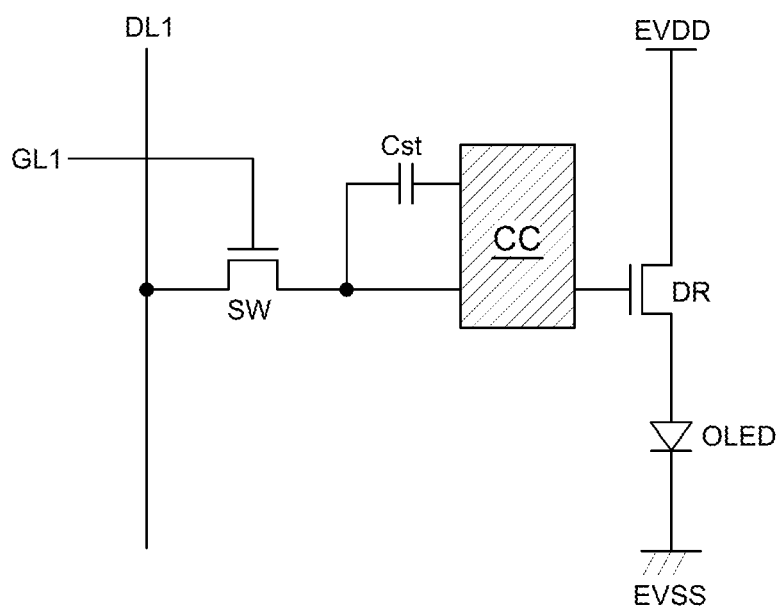
FIG. 2 schematically illustrates a circuit configuration of a sub-pixel.
Figure 3:
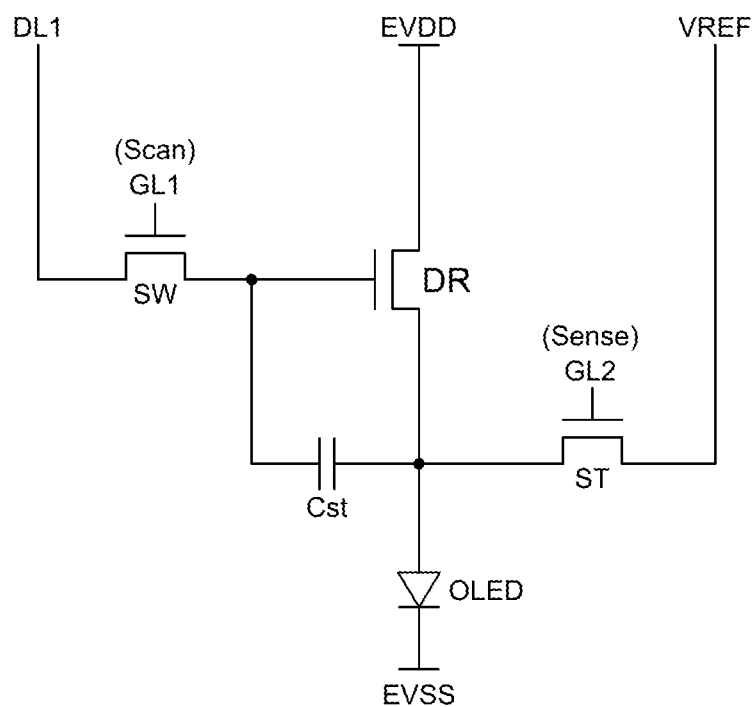
FIG. 3 illustrates an example of a detailed circuit configuration of the sub-pixel.

FIG. 1 is a schematic block diagram of a transparent display device. FIG. 2 schematically illustrates a circuit configuration of a sub-pixel. FIG. 3 illustrates an example of a detailed circuit configuration of the sub-pixel.

As shown in FIG. 1, a transparent display device includes an image processor 110, a timing controller 120, a data driver 130, a scan driver 140 and a display panel 150.

The image processor 110 outputs a data enable signal DE together with a data signal DATA supplied from the outside. The image processor 110 may output at least one of a vertical synchronizing signal, a horizontal synchronizing signal and a clock signal in addition to the data enable signal DE, but the illustration of these signals will be omitted for convenience of explanation.

The timing controller 120 receives the data signal DATA together with driving signals including the data enable signal DE or the vertical synchronizing signal, the horizontal synchronizing signal and the clock signal from the image processor 110. The timing controller 120 outputs a gate timing control signal GDC for controlling an operation timing of the scan driver 140 and a data timing control signal DDC for controlling an operation timing of the data driver 130, based on the driving signals.

In response to the data timing control signal DDC supplied from the timing controller 120, the data driver 130 samples and latches the data signal DATA supplied from the timing controller 120. Then, the data driver 130 converts and outputs the signal into a gamma reference voltage. The data driver 130 outputs the data signal DATA through data lines DL1 to DLn. The data driver 130 may be configured in the form of an integrated circuit (IC).

In response to the gate timing control signal GDC supplied from the timing controller 120, the scan driver 140 outputs a scan signal. The scan driver 140 outputs a scan signal through gate lines GL1 to GLm. The scan driver 140 may be configured in the form of an integrated circuit (IC) or may be provided on the display panel 150 in a gate in panel (GIP) scheme.

The display panel 150 displays images in response to the data signal DATA and the scan signal supplied from the data driver 130 and the scan driver 140, respectively. The display panel 150 includes sub-pixels SP that are operated to display images.

As shown in FIG. 2, each sub-pixel SP includes a switching transistor SW, a driving transistor DR, a capacitor Cst, a compensation circuit CC and an organic light emitting diode OLED.

In response to a scan signal supplied through a first gate line GL1, the switching transistor SW performs a switching operation to allow a data signal supplied through a data line DL1 to be stored as a data voltage in the capacitor Cst. The driving transistor DR operates to allow a driving current to flow between a power line EVDD (high-potential voltage) and a cathode power line EVSS (low-potential voltage) depending on the data voltage stored in the capacitor Cst.

The organic light emitting diode OLED operates to emit light depending on a driving current formed by the driving transistor DR.

The compensation circuit CC is a circuit that is added inside a sub-pixel so as to compensate for a threshold voltage of the driving transistor DR. The compensation circuit CC includes at least one transistor. The compensation circuit CC has various configurations depending on an external compensation method. An example thereof will be described below.

As illustrated in FIG. 3, the compensation circuit CC includes a sensing transistor ST and a sensing line VREF (or a reference line). The sensing transistor ST is connected between a source electrode of the driving transistor DR and an anode electrode of the organic light emitting diode OLED (hereinafter, referred to as a sensing node). The sensing transistor ST operates to supply an initialization voltage (or sensing voltage) received through the sensing line VREF to the sensing node of the driving transistor DR. Otherwise, the sensing transistor ST operates to sense a voltage or current of the sensing node of the driving transistor DR or a voltage or current of the sensing line VREF.

The switching transistor SW includes a drain electrode connected to a first data line DL1 and a source electrode connected to a gate electrode of the driving transistor DR. The driving transistor DR includes a drain electrode connected to a power line EVDD and a source electrode connected to the anode electrode of the organic light emitting diode OLED. The capacitor Cst includes a first capacitor electrode connected to the gate electrode of the driving transistor DR and a second capacitor electrode connected to the anode electrode of the organic light emitting diode OLED. The organic light emitting diode OLED includes the anode electrode connected to the source electrode of the driving transistor DR and a cathode electrode connected to a second power line EVSS. The sensing transistor ST includes a drain electrode connected to the sensing line VREF and a source electrode connected to the anode electrode of the organic light emitting diode OLED and the source electrode of the driving transistor DR which is a sensing node. In the above description, the transistors are implemented as n-type transistors, but may not be limited thereto.

An operation time of the sensing transistor ST may be similar/identical to or different from an operation time of the switching transistor SW depending on an external compensation algorithm (or configuration of the compensation circuit). For example, the gate electrode of the switching transistor SW may be connected to a first gate line GL1 and the gate electrode of the sensing transistor ST may be connected to a second gate line GL2. In this case, a scan signal Scan is transmitted to the first gate line GL1 and a sensing signal Sense is transmitted to the second gate line GL2. In another example, the first gate line GL1 connected to the gate electrode of the switching transistor SW and the second gate line GL2 connected to the gate electrode of the sensing transistor ST may be connected to be commonly shared.

The sensing line VREF may be connected to the data driver. In this case, the data driver may sense a sensing node of each sub-pixel and generate a sensing result in real time, in a non-display time of an image, or in a time period of $N^{th}$ frame (N is an integer equal to or greater than 1). Meanwhile, the switching transistor SW and the sensing transistor ST may be turned on at the same time. In this case, a sensing operation through the sensing line VREF and a data output operation of outputting a data signal may be separated (differentiated) on a basis of a time-division scheme of the data driver.

Further, a compensation target according to the sensing result may be a digital data signal, an analog data signal, a gamma voltage, and the like. Furthermore, the compensation circuit which generates a compensation signal (or a compensation voltage) based on the sensing result may be provided inside the data driver or inside the timing controller. Otherwise, the compensation circuit may be implemented as a separate circuit.

FIG. 3 illustrates an example of a sub-pixel having a 3T(Transistor)1C(Capacitor) structure including the switching transistor SW, the driving transistor DR, the capacitor Cst, the organic light emitting diode OLED, and the sensing transistor ST. However, if the compensation circuit CC is added, a sub-pixel may be configured having a 3T2C, 4T2C, 5T1C, or 6T2C structure. Hereinafter, an example of a sub-pixel having a 3T1C structure will be described for convenience of explanation.

Figure 4:
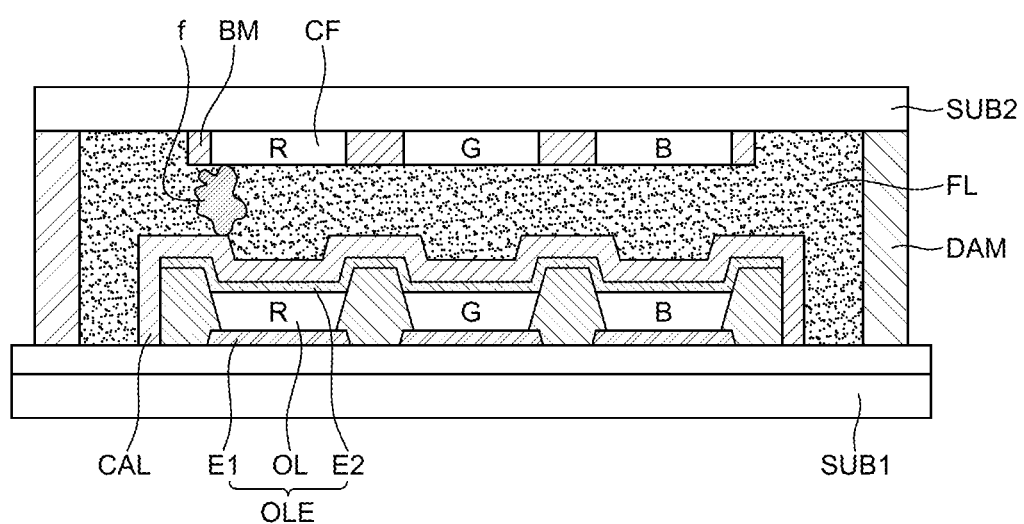
FIG. 4 is a cross-sectional view schematically illustrating a display device according to a comparative example.
Figure 5:
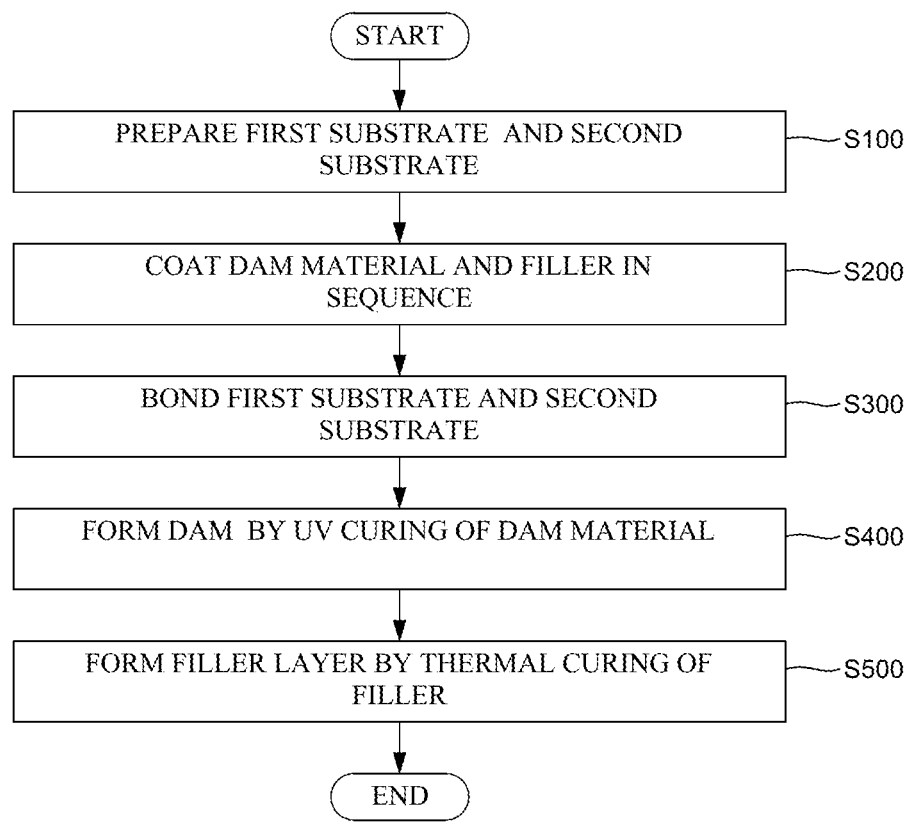
FIG. 5 illustrates a process of forming the display device according to the comparative example in a time-sequential manner.

FIG. 4 is a cross-sectional view schematically illustrating a display device according to a comparative example. FIG. 5 illustrates a process of forming the display device according to the comparative example in a time-sequential manner.

Referring to FIG. 4, a transparent display device according to the comparative example includes a display panel including a first substrate SUB1 and a second substrate SUB2 facing each other. The first substrate SUB1 and the second substrate SUB2 may be bonded to each other using a dam DAM. The dam DAM may be on the edges of the first substrate SUB1 and the second substrate SUB2. The dam DAM may function to fix the first substrate SUB1 and the second substrate SUB2 and maintain a predetermined bonding distance between the first substrate SUB1 and the second substrate SUB2. The dam DAM may be a sealant but may not be limited thereto.

The first substrate SUB1 may be a transistor array substrate. The first substrate SUB1 may include sub-pixels each having an organic light emitting diode OLE. Each of the sub-pixels may further include at least one transistor for driving the organic light emitting diode OLE. The organic light emitting diode OLE may include a first electrode E1, a second electrode E2 and an organic emission layer OL interposed between the first electrode E1 and the second electrode E2. The first substrate SUB1 may further include a capping layer CAL that covers the sub-pixels. The capping layer CAL may be formed on the second electrode E2. The capping layer CAL may function to compensate for a color viewing angle.

The second substrate SUB2 may be a color filter substrate. The second substrate SUB2 may function as an encapsulation substrate. A black matrix BM and a color filter CF may be formed on the second substrate SUB2. The black matrix BM may function to suppress color mixing defects between sub-pixels adjacent to each other. The black matrix BM may be disposed to expose an emission area.

The color filter CF may include red (R), blue (B) and green (G) color filters CF. The red (R), blue (B) and green (G) color filters CF may be assigned to corresponding red (R), blue (B) and green (G) sub-pixels, respectively. The red (R), blue (B) and green (G) color filters CF may be partitioned by the black matrix BM.

A filler layer FL is interposed between the first substrate SUB1 and the second substrate SUB2 and includes a plurality of fillers. The filler layer FL may be provided to maintain a cell gap between the first substrate SUB1 and the second substrate SUB2.

Further referring to FIG. 5, the display panel may be formed by the following process. The display panel forming process may include first to fifth steps S100, S200, S300, S400 and S500. However, the forming process may be further divided into more steps and another step may be added thereto.

A first step S100 may be a step of preparing the first substrate SUB1 on which a transistor T and the organic light emitting diode OLE have been formed and the second substrate SUB2 on which the black matrix BM and the color filter CF have been formed. A second step S200 may be a step of coating a filler on the second substrate SUB2 and a dam material on the edge. A third step S300 may be a step of bonding the first substrate SUB1 and the second substrate SUB2 to each other. A fourth step S400 may be a step of forming the dam DAM by UV curing of the dam material. A fifth step S500 may be a step of forming the filler layer FL by thermal curing of the filler.

The display device of the comparative example formed by the above-described process may have the following problems.

First, misalignment may occur. Specifically, the bonding step in the third step S300 may be performed after a step of aligning the first substrate SUB1 and the second substrate SUB2. In the aligning step, an alignment key or the like may be used. However, in the third step S300, the filler and the dam material interposed between the first substrate SUB1 and the second substrate SUB2 are not yet cured and have mobility. Therefore, during a transfer into a chamber for performing the third step S300 and the fourth step S400, the mobility of the filler and the dam material may cause misalignment. Such misalignment may occur due to a process variation during the bonding step in the third step S300 using a bonding device.

If misalignment occurs, optical properties may be degraded, which causes the degradation in image quality of a transparent display device. Also, in this case, the sizes of an emission area and a transmission area may vary depending on the location, and, thus, it may be difficult for the transparent display device to perform its own function.

Further, sagging of the second substrate SUB2 may occur. Specifically, in the third step S300, a central portion of the second substrate SUB2 may sag, and, thus, the second substrate SUB2 may be deformed, which may be a problem particularly in a large-area display device. In this case, the shape deformation may cause the degradation in optical properties depending on the location. Furthermore, the sagging of the second substrate SUB2 may push out a foreign material f remaining between the first substrate SUB1 and the second substrate SUB2 toward the organic light emitting diode OLE. In this case, the foreign material f becomes a problem because it may cause a short between the first electrode E1 and the second electrode E2 in the organic light emitting diode OLE.

Moreover, outgas generated when the filler layer FL is formed may cause the degradation of elements. Specifically, the filler may be filled between the first substrate SUB1 and the second substrate SUB2 to maintain a cell gap between the first substrate SUB1 and the second substrate SUB2. In this case, a filler layer is formed by curing the filler, and the outgas generated in this process may cause the degradation of elements.

Figure 6:
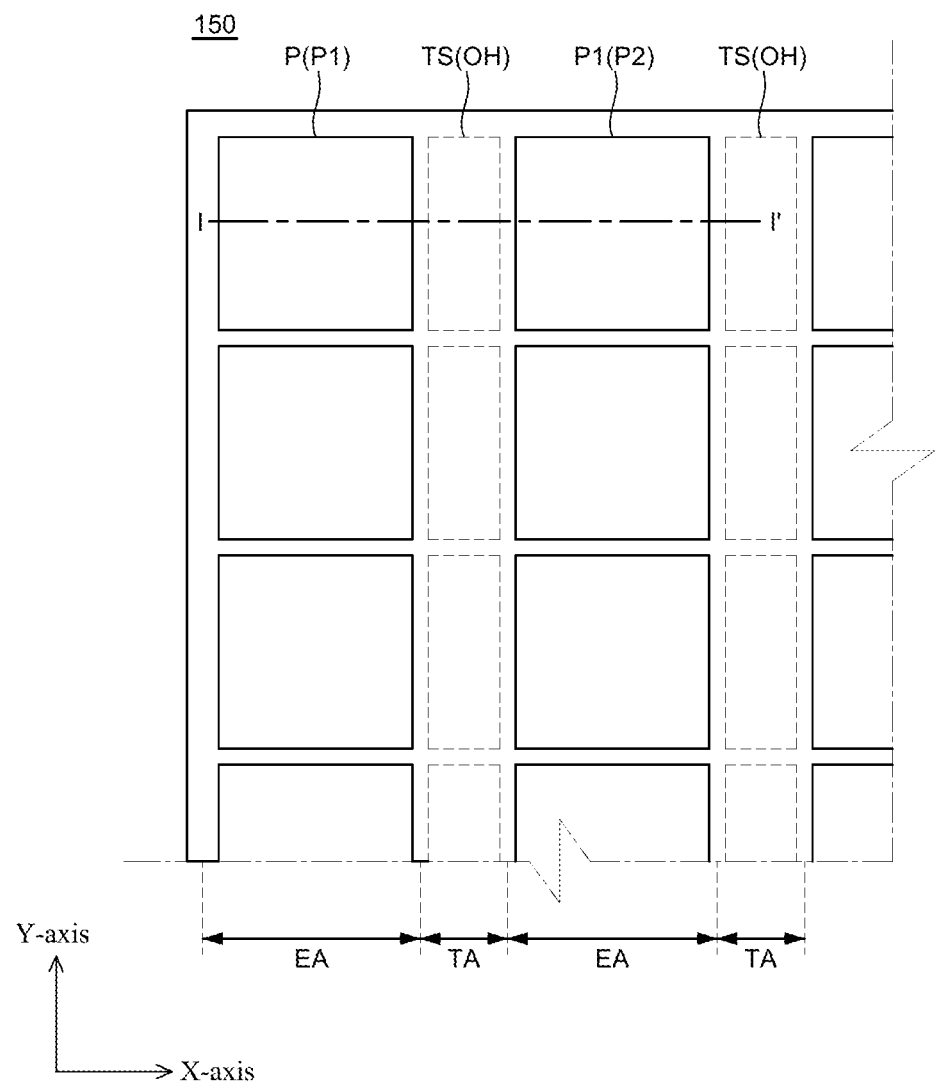
FIG. 6 schematically illustrates a part of a display panel according to a first aspect of the present disclosure.
Figure 7:
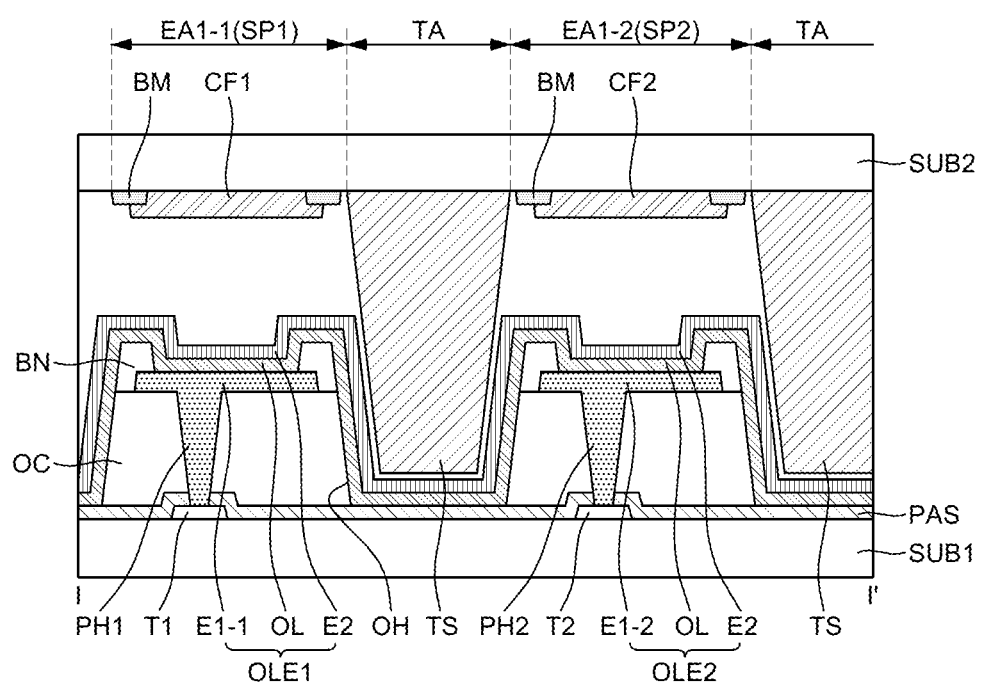
FIG. 7 is a cross-sectional view as taken along a line I-I' of FIG. 6 according to the first aspect.

FIG. 6 schematically illustrates a part of a display panel according to a first aspect of the present disclosure. FIG. 7 is a cross-sectional view as taken along a line I-I' of FIG. 6 according to the first aspect. FIG. 8A, FIG. 8B, FIG. 8C, FIG. 9A and FIG. 9B illustrate examples of the shape of a transparent spacer and an open hole.

Referring to FIG. 6, a transparent display device according to the present disclosure includes a display panel 150 including pixels P. The pixels P may be disposed in a matrix form in a first direction (for example, X-axis direction) and a second direction (for example, Y-axis direction) crossing each other, but may not be limited thereto.

The display panel 150 may include first areas EA and second areas TA. Each second area TA may be disposed between first areas EA adjacent to each other. For example, the first areas EA and the second areas TA may be alternately disposed in sequence in the first direction as shown in the drawing. However, the present disclosure is not limited thereto. The first areas EA and the second areas TA may also be alternately disposed in sequence in the second direction. Otherwise, the second areas TA may also be defined as areas outside the first areas EA.

Each first area EA may be defined as an area where light for displaying input images is emitted. The first area EA may correspond to an area where pixels P are disposed. Each pixel P includes sub-pixels. The pixel P may include red (R), green (G), blue (B) and white (W) sub-pixels but may not be limited thereto. Hereinafter, an example of a pixel P including red (R), green (G), blue (B) and white (W) sub-pixels will be described for convenience of explanation. Each sub-pixel may include an organic light emitting diode and a circuit unit electrically connected to the organic light emitting diode. The circuit unit may include at least one transistor and at least one capacitor. The first area EA may be referred to as an emission area.

The transparent display device according to an aspect of the present disclosure may be implemented as a top emission type. Thus, most of the areas where the pixels P are disposed may be assigned as the first area EA.

Each second area TA may be defined as an area which transmits external light so that a user may recognize objects located on the rear surface of the transparent display device. Otherwise, the second area TA may be defined as an area where signal lines are not disposed outside the first area EA. However, if signal lines are formed of a transparent material and have a predetermined transparency, an area where the signal lines are disposed may also be assigned as the second area TA. The second area TA may be referred to as a transmission area.

A transparent spacer TS may be located in the second area TA. The transparent spacer TS may be located between pixels P adjacent to each other. For example, the transparent spacer TS may be located between pixels P adjacent to each other in the first direction. As will be described later, the transparent spacer TS may be used for alignment when the first substrate SUB1 and the second substrate SUB2 are bonded to each other and used to maintain a cell gap between the first substrate SUB1 and the second substrate SUB2.

Referring to FIG. 7, the display panel 150 includes the first substrate SUB1 and the second substrate SUB2 facing the first substrate SUB1. The display panel 150 may include the first areas EA and the second areas TA. The first areas EA may include a first sub-area (such as 1-1 area EA1-1) and second sub-area (such as a 1-2 area EA1-2) disposed adjacent to each other with the second area TA interposed therebetween. In the 1-1 area EA1-1, a first sub-pixel SP1 included in a first pixel P1 may be located. In the 1-2 area EA1-2, a second sub-pixel SP2 included in a second pixel P2 may be located.

The first substrate SUB1 may be a transistor array substrate. The first substrate SUB1 may include transistors T1 and T2 and organic light emitting diodes OLE1 and OLE2.

The first sub-pixel SP1 includes a first transistor T1 formed on the first substrate SUB1 and a first organic light emitting diode OLE1 electrically connected to the first transistor T1. The first transistor T1 may have any one of various structures such as a top gate structure, a bottom gate structure and a double gate structure. The first organic light emitting diode OLE1 includes a first sub-electrode of a first electrode (such as 1-1 electrode E1-1), a second electrode E2 and an organic emission layer OL interposed between the 1-1 electrode E1-1 and the second electrode E2.

The second sub-pixel SP2 includes a second transistor T2 formed on the first substrate SUB1 and a second organic light emitting diode OLE2 electrically connected to the second transistor T2. The second transistor T2 may have the same structure as the first transistor T1. The second organic light emitting diode OLE2 includes a second sub-electrode of the first electrode (such as a 1-2 electrode E1-2), the second electrode E2 and the organic emission layer OL interposed between the 1-2 electrode E1-2 and the second electrode E2.

The organic emission layer OL and the second electrode E2 may be widely formed to cover a plurality of pixels P. For example, the first sub-pixel SP1 of the first pixel P1 and the second sub-pixel SP2 of the second pixel P2 may share the organic emission layer OL and the second electrode E2.

More specifically, the first transistor T1 and the second transistor T2 may be located on the first substrate SUB1. The first transistor T1 may be located in the 1-1 area EA1-1, and the second transistor T2 may be located in the 1-2 area EA1-2.

On the first transistor T1 and the second transistor T2, a passivation layer PAS may be located. The passivation layer PAS protects the first transistor T1 and the second transistor T2 and may be a silicon oxide (SiOx) layer, a silicon nitride (SiNx) layer, or a multilayer thereof.

A planarization layer OC is located on the passivation layer PAS. The planarization layer OC reduces a step of an underlying structure and may be formed of an organic material such as photo acryl, polyimide, benzocyclobutene series resin and acrylate series resin.

The first organic light emitting diode OLE1 and the second organic light emitting diode OLE2 may be located on the planarization layer OC. More specifically, the 1-1 electrode E1-1 and the 1-2 electrode E1-2 are located on the planarization layer OC. The 1-1 electrode E1-1 may be located in the 1-1 area EA1-1, and the 1-2 electrode E1-2 may be located in the 1-2 area EA1-2.

Each of the 1-1 electrode E1-1 and the 1-2 electrode E1-2 may include a reflective layer and function as a reflective electrode. The reflective layer may be formed of aluminum (Al), copper (Cu), silver (Ag), nickel (Ni), or an alloy thereof, or may be formed of APC (silver/palladium/copper alloy). Each of the 1-1 electrode E1-1 and the 1-2 electrode E1-2 may be formed of a multilayer including the reflective layer.

The 1-1 electrode E1-1 may be electrically connected to the first transistor T1 through a first pixel contact hole PH1 penetrating the passivation layer PAS and the planarization layer OC. The 1-2 electrode E1-2 may be electrically connected to the second transistor T2 through a second pixel contact hole PH2 penetrating the passivation layer PAS and the planarization layer OC.

A bank layer BN is located on the first substrate SUB1 on which the 1-1 electrode E1-1 and the 1-2 electrode E1-2 have been formed. The bank layer BN includes an opening through which most of the 1-1 electrode E1-1 and the 1-2 electrode E1-2 are exposed. The bank layer BN may be formed of an organic material such as polyimide, benzocyclobutene series resin and acrylate. The bank layer BN may be disposed to expose central portions of the 1-1 electrode E1-1 and the 1-2 electrode E1-2 and cover side ends of the 1-1 electrode E1-1 and the 1-2 electrode E1-2.

To secure a predetermined transmittance of the second area TA, at least some of the insulating layers formed in the second area TA may be removed. For example, as illustrated in the drawing, the planarization layer OC and the bank layer BN may be removed from at least a part of the second area TA. Although not illustrated in the drawing, at least one of a buffer layer, an interlayer insulating layer IN and the passivation layer PAS may be removed from at least a part of the second area TA. However, it is to be noted that the above-described insulating layers may be removed under conditions in which a short of electrodes and/or signal lines that are disposed in the second area TA may be suppressed. A hole OH prepared by removing the insulating layers in the second area TA may be referred to as an open hole OH.

The organic emission layer OL is located on the 1-1 electrode E1-1 and the 1-2 electrode E1-2 exposed through the bank layer BN. The organic emission layer OL may be widely formed on the entire surface of the first substrate SUB1. For example, the organic emission layer OL may be extended and formed as one body on the 1-1 area EA1-1, the second area TA and the 1-2 area EA1-2.

The organic emission layer OL is a layer in which electrons and holes are combined to emit light and includes an emission layer EML (not shown). The organic emission layer OL may further include any one or more of a hole injection layer HIL, a hole transport layer HTL, an electron transport layer ETL and an electron injection layer EIL (not shown). The emission layer EML may be configured to emit white light. In this case, each sub-pixel SP may be combined with a corresponding color filter to implement red (R), green (G), blue (B) or white (W) color.

The second electrode E2 is located on the organic emission layer OL. The second electrode E2 may be widely formed on the entire surface of the first substrate SUB1. For example, the second electrode E2 may be extended and formed as one body on the 1-1 area EA1-1, the second area TA and the 1-2 area EA1-2. The second electrode E2 may be formed of a transparent conductive material such as indium tin oxide (ITO) and indium zinc oxide (IZO). Alternatively, the second electrode E2 may be formed of a material, which is thin enough to transmit light, for example, magnesium (Mg), calcium (Ca), aluminum (Al), silver (Ag), or an alloy thereof.

The second substrate SUB2 may be a color filter substrate. The second substrate SUB2 may function as an encapsulation substrate. The second substrate SUB2 may include the black matrix BM and the color filter CF. The black matrix BM may function to suppress color mixing defects between sub-pixels adjacent to each other. The black matrix BM may be disposed to expose an emission area.

The color filter CF may be disposed in the 1-1 area EA1-1 and the 1-2 area EA1-2. The color filter CF may include a first color filter CF1 disposed in the 1-1 area EA1-1 and a second color filter CF2 disposed in the 1-2 area EA1-2. The sequence of laminating the black matrix BM and the color filter CF on the second substrate SUB2 may be changed. That is, the color filter CF may be formed after the black matrix BM is formed, or the black matrix BM may be formed after the color filter CF is formed. The black matrix BM may function to suppress color mixing defects between sub-pixels adjacent to each other.

The color filter CF may include red (R), blue (B) and green (G) color filters CF. The red (R), blue (B) and green (G) color filters CF may be assigned to corresponding red (R), blue (B) and green (G) sub-pixels, respectively. The red (R), blue (B) and green (G) color filters CF may be partitioned by the black matrix BM.

Although not illustrated in the drawing, the color filter CF may be formed on the first substrate SUB1. That is, the color filter CF may be located on the second electrode E2 included in the organic light emitting diode OLE on the first substrate SUB1. In this case, a distance between the color filter CF and the organic emission layer OL may be reduced. Therefore, it is possible to increase a viewing angle and thus possible to secure a sufficient aperture ratio.

The transparent spacer TS may be located on the second substrate SUB2. The transparent spacer TS may be disposed in the second area TA. The transparent spacer TS may be formed of a transparent material having a predetermined transmittance. For example, the transparent spacer TS may be formed of an organic material such as photo acryl, polyimide, benzocyclobutene series resin and acrylate series resin. Since the transparent spacer TS is formed of a transparent material, a decrease in transmittance of the second area TA may be minimized. That is, even if the transparent spacer TS is disposed in the second area TA, a sufficient transmittance may be secured.

The transparent spacer TS may have a shape protruding toward the first substrate SUB1. The transparent spacer TS may be inserted into an inner space inside the open hole OH. The shape of the transparent spacer TS may correspond to the shape of the open hole OH. For example, the transparent spacer TS may have a reverse tapered cross section and the open hole OH may have a tapered cross section. For another example, the transparent spacer TS may have a rectangular or square cross section and the open hole OH may have a rectangular or square cross section corresponding thereto.

Referring to FIG. 8A, FIG. 8B, FIG. 8C, FIG. 9A and FIG. 9B, the transparent spacer TS may be formed on the second substrate SUB2. A cross section of the transparent spacer TS may include a first top side TS1, a first bottom side BS1, a first right side RS1 and a first left side LS1 that determine the outward form. The first top side TS1 may be fixed to the second substrate SUB2. The first top side TS1 may be in direct contact with the second substrate SUB2. The first bottom side BS1 may face the first top side TS1. The first right side RS1 may connect one side of the first bottom side BS1 and one side of the first top side TS1. The first left side LS1 may connect the other side of the first bottom side BS1 and the other side of the first top side TS1.

A cross section of the open hole OH may include a second bottom side BS2 and a second right side RS2 extended from one side of the second bottom side BS2 toward the second substrate SUB2. Further, the cross section of the open hole OH may include a second left side LS2 extended from the other side of the second bottom side BS2 toward the second substrate SUB2. The transparent spacer TS may be pulled into an inner space IS formed by the second bottom side BS2, the second right side RS2 and the second left side LS2.

The first bottom side BS1 and the second bottom side BS2 may face each other. The first bottom side BS1 may be in direct contact with the second bottom side BS2. The first right side RS1 and the second right side RS2 may face each other. The first right side RS1 may be in direct contact with the second right side RS2. The first left side LS1 and the second left side LS2 may face each other. The first left side LS1 may be in direct contact with the second left side LS2.

An internal angle $\theta 2$ between the first bottom side BS1 and the first right side RS1 may be a right angle or obtuse angle. In correspondence thereto, an internal angle $\theta 2'$ between the second bottom side BS2 and the second right side RS2 may be a right angle or obtuse angle. An internal angle $\theta 1$ between the first bottom side BS1 and the first left side LS1 may be a right angle or obtuse angle. In correspondence thereto, an internal angle $\theta 1'$ between the second bottom side BS2 and the second left side LS2 may be a right angle or obtuse angle.

Figure 8A:
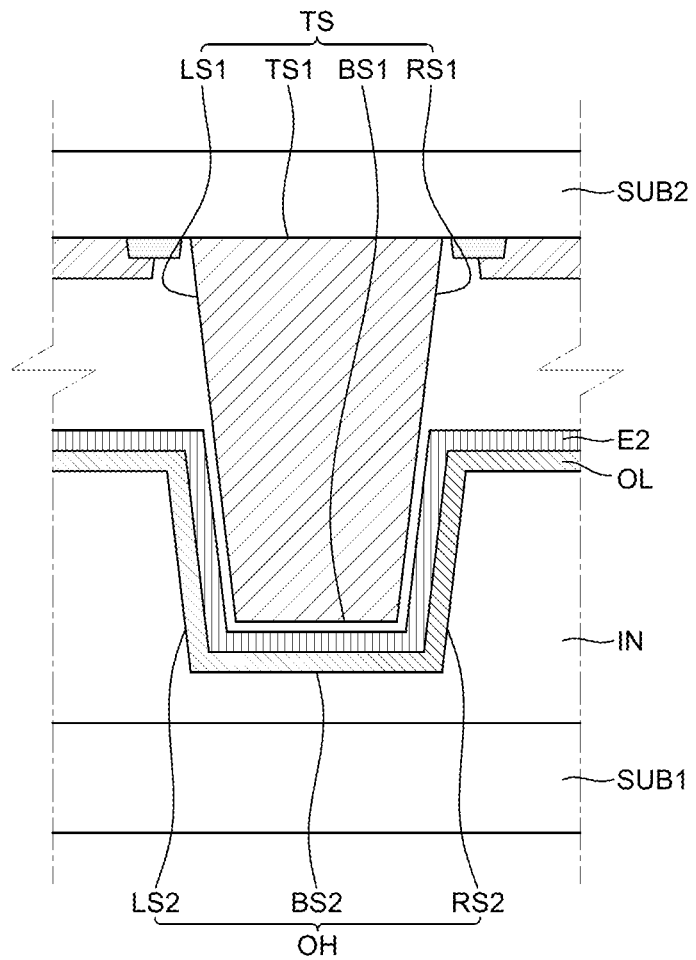
FIG. 8A, FIG. 8B, FIG. 8C, FIG. 9A and FIG. 9B illustrate examples of the shape of a transparent spacer and an open hole.

The open hole OH may be formed by patterning the insulating layer IN located on the first substrate. As shown in FIG. 8A, the open hole OH may be formed by removing a part of the insulating layer IN from the second area TA. For example, the open hole OH may be prepared by patterning the planarization layer OC (FIG. 7) and the bank layer BN (FIG. 7) included in the insulating layer IN. A part of the organic emission layer OL and a part of the second electrode E2 may remain inside the open hole OH. In this case, the first substrate SUB1, a part of the insulating layer IN, the organic emission layer OL and the second electrode E2 may be located in sequence in the second area TA.

Figure 8B:
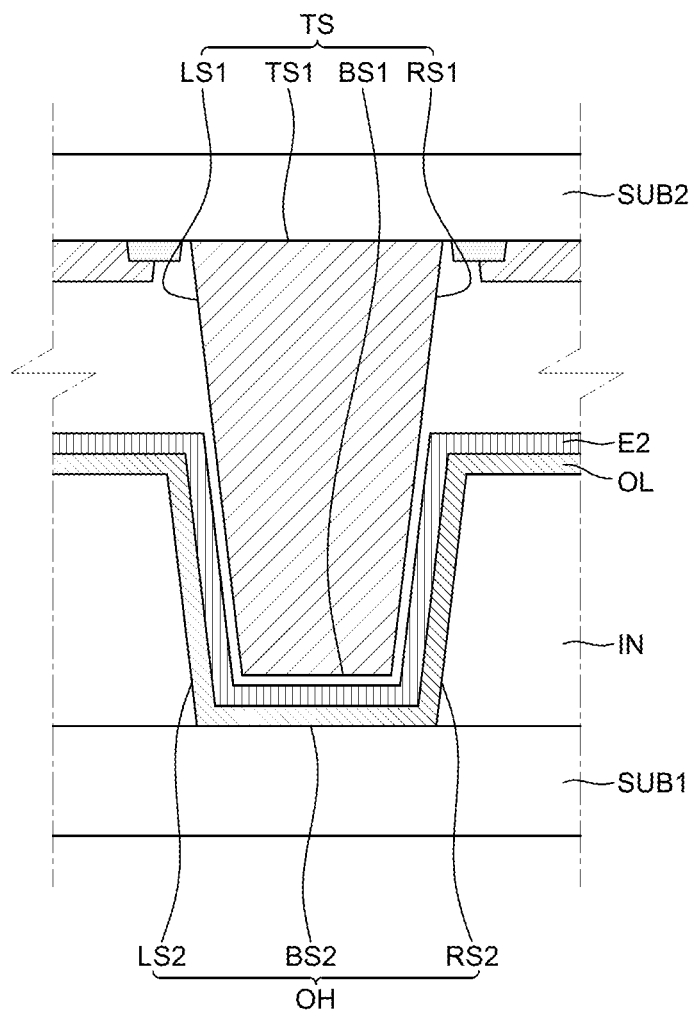

As shown in FIG. 8B, the open hole OH may be formed by completely removing the insulating layer IN from the second area TA. For example, the open hole OH may be prepared by patterning all of the insulating layers IN located in the second area TA. A part of the organic emission layer OL and a part of the second electrode E2 may remain inside the open hole OH. In this case, the first substrate SUB1, the organic emission layer OL and the second electrode E2 may be located in sequence in the second area TA.

Figure 8C:
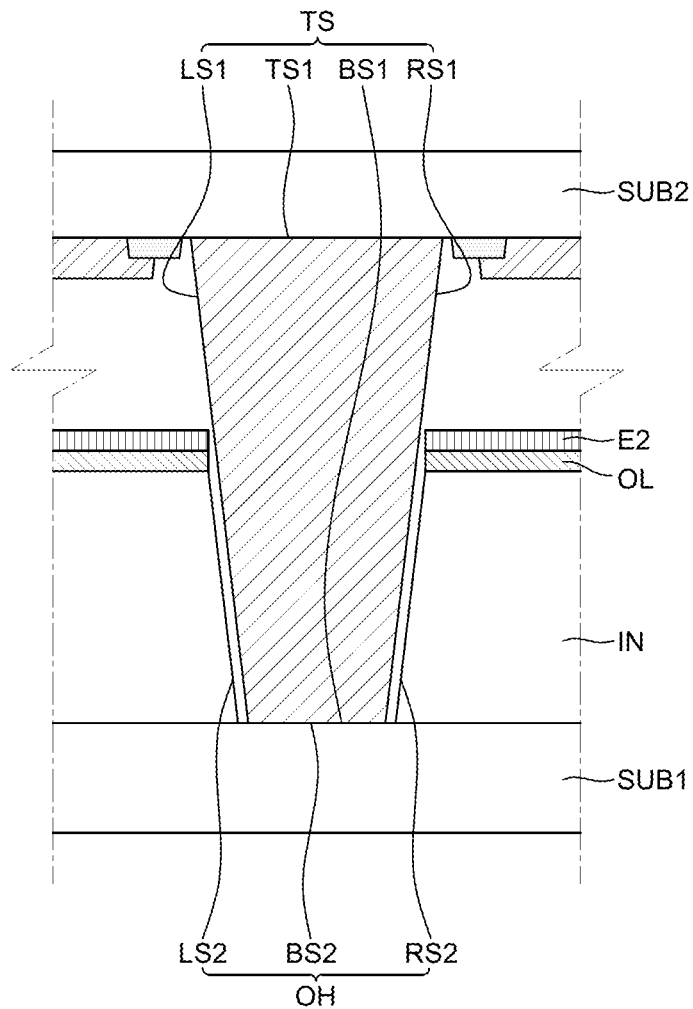
Figure 9A:
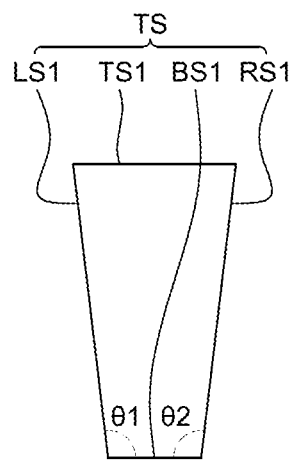
Figure 9B:
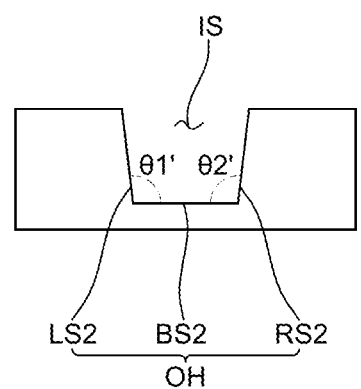

As shown in FIG. 8C, the open hole OH may be formed by completely removing the insulating layer IN from the second area TA. For example, the open hole OH may be prepared by patterning all of the insulating layers IN located in the second area TA and may expose the first substrate SUB1. Also, unlike the structure illustrated in FIG. 8B, the organic emission layer OL and the second electrode E2 located in the second area TA may be removed from the inside of the open hole OH. In this case, the transparent spacer TS may be in direct contact with the first substrate SUB1 in the second area TA. Herein, the transparent spacer TS may contain low-melting point glass, e.g., frit powder, and thus may be fixed to the first substrate SUB1 by fusion bonding.

Herein, the organic emission layer OL is formed and connected as one body in the entire area except for the open hole OH and thus may maintain continuity. Also, the second electrode E2 is formed and connected as one body in the entire area except for the open hole OH and thus may maintain continuity.

The transparent spacer TS is pulled into the open hole OH so that its movement may be restricted or limited in a predetermined range. That is, the transparent spacer TS is fixed to the second substrate SUB2 and the insulating layers IN including the open hole OH are fixed to the first substrate SUB1. Therefore, due to a combination of the transparent spacer TS with the open hole OH, a movement of the second substrate SUB2 may be restricted by the first substrate SUB1 and a movement of the first substrate SUB1 may be restricted by the second substrate SUB2.

The transparent spacer TS and the open hole OH may be used for alignment when the first substrate SUB1 and the second substrate SUB2 are bonded to each other. That is, the transparent spacer TS formed on the second substrate SUB2 and the open hole OH formed in the first substrate SUB1 may guide a bonding position when the first substrate SUB1 and the second substrate SUB2 are bonded to each other. In the transparent display device according to the first aspect of the present disclosure, the transparent spacer TS and the open hole OH are formed. Thus, it is possible to effectively suppress misalignment occurring when the first substrate SUB1 and the second substrate SUB2 are bonded to each other.

Further, the transparent spacer TS may function to stably maintain a cell gap between the first substrate SUB1 and the second substrate SUB2. Therefore, in an aspect of the present disclosure, a filler layer between the first substrate SUB1 and the second substrate SUB2 may be omitted. Thus, it is possible to suppress element degradation caused by outgassing which may occur when a filler layer is formed.

Furthermore, the transparent spacer TS may function to suppress sagging of the second substrate SUB2. Therefore, in an aspect of the present disclosure, it is possible to suppress the degradation in optical properties caused by the shape deformation of the second substrate SUB2. Also, it is possible to suppress a short between the first electrode E1 and the second electrode E2 in the organic light emitting diode OLE which may occur when a foreign material remaining in the second substrate SUB2 is moved by the deformation of the second substrate SUB2.

Figure 10A:
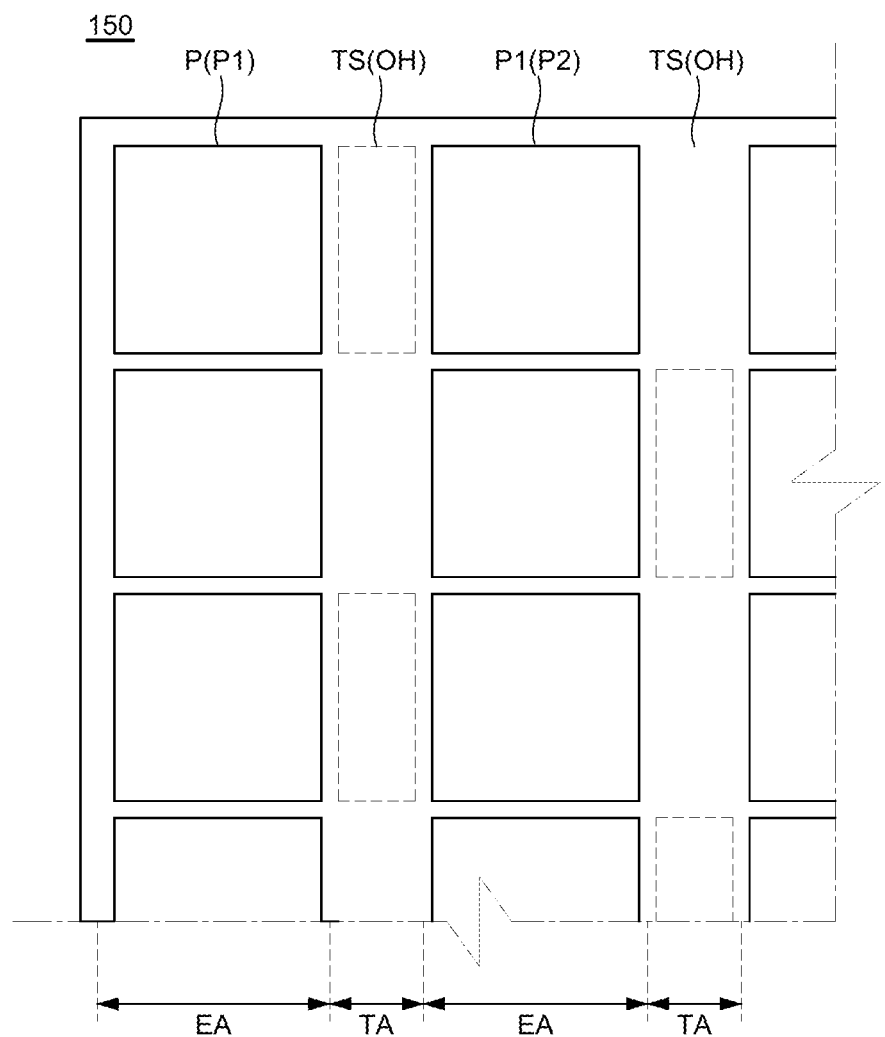
FIG. 10A and FIG. 10B illustrate examples of the position where the transparent spacer and the open hole are formed.
Figure 10B:
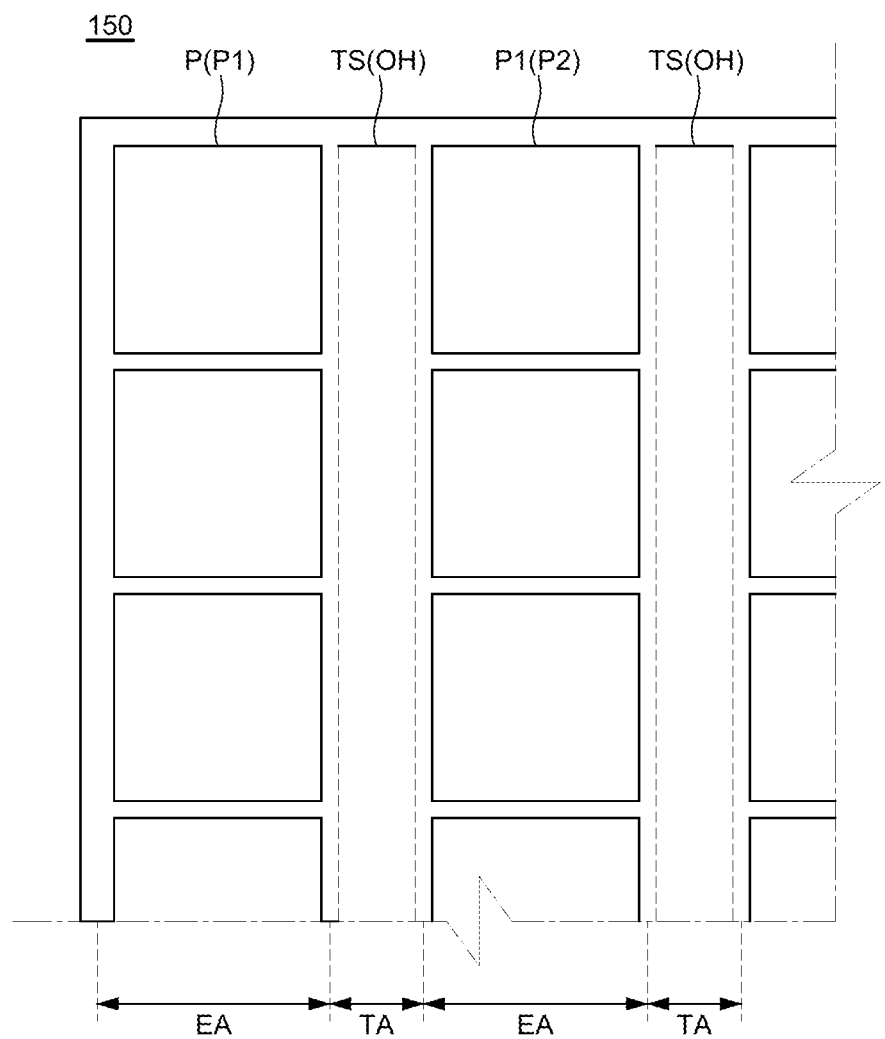

FIG. 10A and FIG. 10B illustrate examples of the position where the transparent spacer and the open hole are formed.

In an aspect, as shown in FIG. 6, each transparent spacer TS may be disposed between two pixels P adjacent to each other. For example, a plurality of transparent spacers TS may be disposed in the second direction in the second area TA. Herein, each of the plurality of transparent spacers TS may be disposed between a pair of pixels P adjacent to each other in the first direction.

In another aspect, as shown in FIG. 10A, each transparent spacer TS may be selectively disposed between two pixels P adjacent to each other. For example, the transparent spacers TS may be disposed in the second direction in the second area TA. Herein, each of the plurality of transparent spacers TS may be disposed between a pair of pixels P adjacent to each other in the first direction selectively only in a predetermined area.

In yet another aspect, as shown in FIG. 10B, each transparent spacer TS may be disposed between two pixels P adjacent to each other. For example, each transparent spacer TS may be extended in the second direction in the second area TA. Herein, each transparent spacer TS may be located and extended between a plurality of pairs of pixels P adjacent to each other in the first direction.

Figure 11:
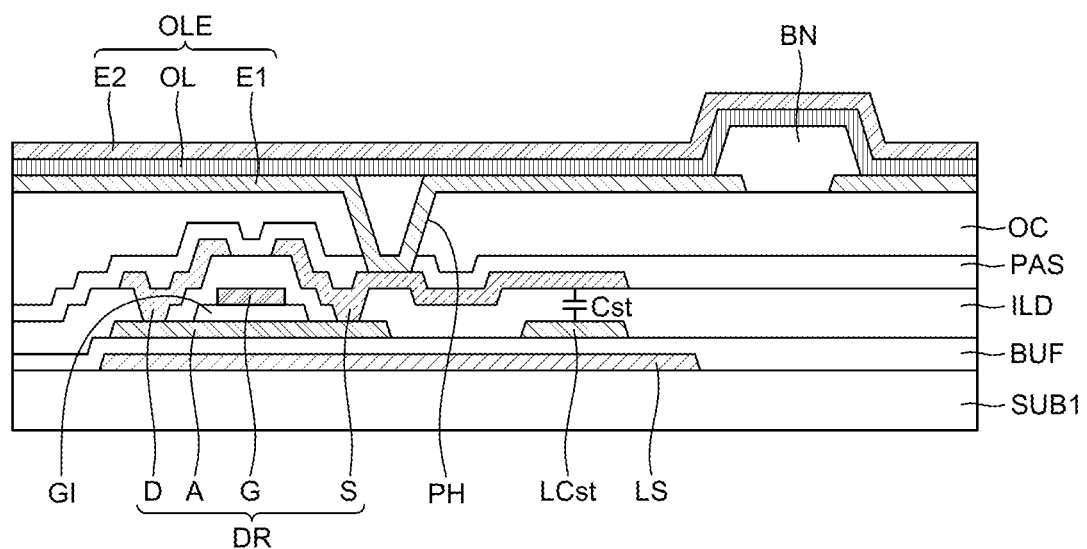
FIG. 11 is a cross-sectional view schematically illustrating a structure example of a transistor and an organic light emitting diode on a first substrate.

FIG. 11 is a cross-sectional view schematically illustrating a structure example of a transistor and an organic light emitting diode on a first substrate.

A light-shielding layer LS is located on the first substrate SUB1. The light-shielding layer LS blocks light incident from the outside and suppresses the generation of photoelectric current in a transistor. The buffer layer BUF is located on the light-shielding layer LS. The buffer layer BUF protects a thin film transistor, which is to be formed in a subsequent process, from impurities, such as alkali ions, flowing out from the light-shielding layer LS. The buffer layer BUF may be silicon oxide (SiOX), silicon nitride (SiNx) or a multilayer thereof.

A semiconductor layer A of the driving transistor DR is located on the buffer layer BUF and a capacitor lower electrode LCst is located apart from the semiconductor layer A. The semiconductor layer A and the capacitor lower electrode LCst may be formed of a silicon semiconductor or an oxide semiconductor. The silicon semiconductor may include amorphous silicon or crystallized polycrystalline silicon. The semiconductor layer A includes a drain region and a source region each containing p-type or n-type impurities and also includes a channel between the drain region and the source region. The capacitor lower electrode LCst may also be doped with impurities and become conductive.

A gate insulating layer GI may be located on the semiconductor layer A and the capacitor lower electrode LCst. The gate insulating layer GI may be silicon oxide (SiOx), silicon nitride (SiNx) or a multilayer thereof. At a certain region of the gate insulating layer GI on the semiconductor layer A, i.e., at a position corresponding to the channel when impurities are injected, a gate electrode G is located. The gate electrode G is formed of any one selected from the group consisting of molybdenum (Mo), aluminum (Al), chromium (Cr), gold (Au), titanium (Ti), nickel (Ni), neodymium (Nd) and copper (Cu), or an alloy thereof. Further, the gate electrode G may be a multilayer formed of any one selected from the group consisting of molybdenum (Mo), aluminum (Al), chromium (Cr), gold (Au), titanium (Ti), nickel (Ni), neodymium (Nd) and copper (Cu), or an alloy thereof. For example, the gate electrode G may be a dual layer of molybdenum/aluminum-neodymium or molybdenum/aluminum.

An interlayer insulating layer ILD that insulates the gate electrode G is located on the gate electrode G. The interlayer insulating layer ILD may be silicon oxide (SiOx), silicon nitride (SiNx) or a multilayer thereof. A source electrode S and a drain electrode D are located on the interlayer insulating layer ILD. The source electrode S and the drain electrode D are connected to the semiconductor layer A through a contact hole through which the source region of the semiconductor layer A is exposed. Each of the source electrode S and the drain electrode D may be formed as a single layer or a multilayer. If each of the source electrode S and the drain electrode D is formed as a single layer, it may be formed of any one selected from the group consisting of molybdenum (Mo), aluminum (Al), chromium (Cr), gold (Au), titanium (Ti), nickel (Ni), neodymium (Nd) and copper (Cu), or an alloy thereof. If each of the source electrode S and the drain electrode D is formed as a multilayer, it may be formed as a dual layer of molybdenum/aluminum-neodymium or a triple layer of titanium/aluminum/titanium, molybdenum/aluminum/molybdenum or molybdenum/aluminum-neodymium/molybdenum. Therefore, the driving transistor DR is configured including the semiconductor layer A, the gate electrode G, the source electrode S and the drain electrode D. Also, the capacitor Cst is configured including the capacitor lower electrode LCst and the source electrode S serving as a capacitor upper electrode.

The passivation layer PAS is located on the first substrate SUB1 including the driving transistor DR and the capacitor Cst. The planarization layer OC is located on the passivation layer PAS. In a part of the planarization layer OC, a pixel contact hole PH through which the passivation layer PAS is exposed to expose the source electrode S is located.

The organic light emitting diode OLE is located on the planarization layer OC. The organic light emitting diode OLE includes the first electrode E1 and the second electrode E2 facing each other and the organic emission layer OL interposed between the first electrode E1 and the second electrode E2. The first electrode E1 may be an anode and the second electrode E2 may be a cathode, but may not be limited thereto. The first electrode E1 may be connected to the source electrode S through the pixel contact hole PH.

Figure 12:
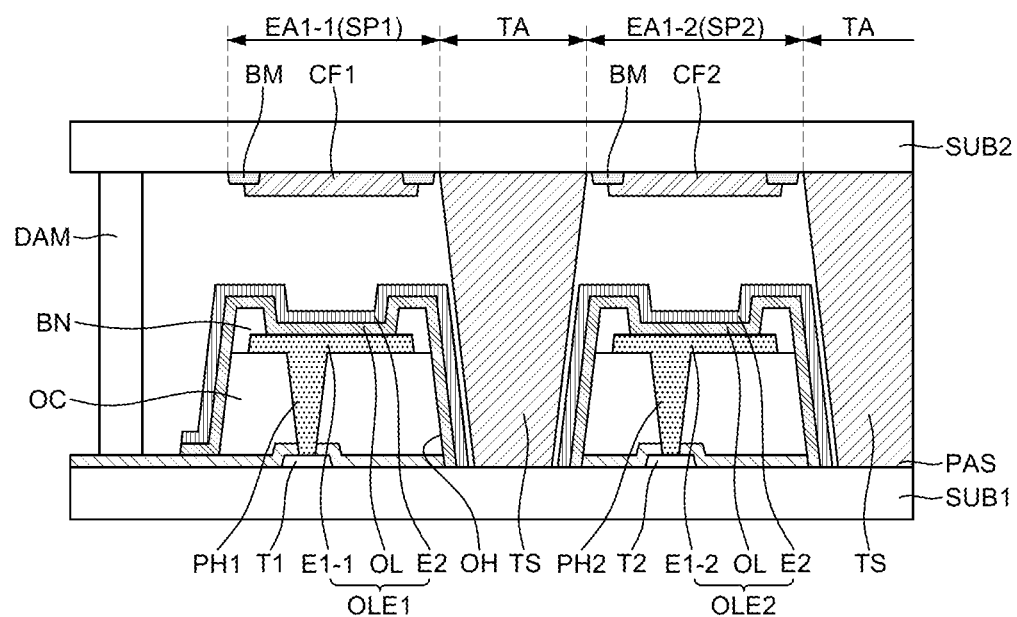
FIG. 12 is a cross-sectional view schematically illustrating a display panel according to a second aspect of the present disclosure.

FIG. 12 is a cross-sectional view schematically illustrating a display panel according to a second aspect of the present disclosure. In the second aspect of the present disclosure, detailed descriptions of parts identical or corresponding to those of the above-described first aspect will be omitted.

Referring to FIG. 12, a transparent display device according to the second aspect includes a display panel including the first substrate SUB1 and the second substrate SUB2 facing each other. The display panel may include first areas EA and second areas TA. The first substrate SUB1 and the second substrate SUB2 may be bonded to each other using the dam DAM. The dam DAM may be disposed on the edges of the first substrate SUB1 and the second substrate SUB2. That is, the dam DAM may be disposed along the edges of the first substrate SUB1 and the second substrate SUB2.

The first substrate SUB1 may be a transistor array substrate. The first substrate SUB1 may include sub-pixels each having a transistor and an organic light emitting diode. In each second area TA, the open hole OH may be prepared between sub-pixels adjacent to each other by patterning the insulating layers.

The second substrate SUB2 may be a color filter substrate. The second substrate SUB2 may function as an encapsulation substrate. The second substrate SUB2 may include the transparent spacer TS. The transparent spacer TS may be pulled into the open hole OH.

The transparent spacer TS may contain low-melting point glass, e.g., frit powder. The transparent spacer TS may further contain a binder for fixing the frit powder to the second substrate SUB2. The transparent spacer TS may be bonded to the second substrate SUB2 by laser fusion bonding.

The open hole OH may be formed to expose the first substrate SUB1 in a predetermined area. In this case, the transparent spacer TS may be in direct contact with the first substrate SUB1. That is, a bottom surface of the transparent spacer TS may be in direct contact with a top surface of the first substrate SUB1. The transparent spacer TS may also be bonded to the first substrate SUB1 by laser fusion bonding. As such, if the first substrate SUB1 and the second substrate SUB2 are fusion bonded to each other using the frit powder, it is possible to suppress the permeation of moisture and oxygen from the outside. This is because the frit powder has pores smaller than water molecules and oxygen molecules and is the same kind of medium as the first substrate SUB1 and the second substrate SUB2. Therefore, a movement of moisture and oxygen between adjacent pixels may be restricted or delayed by the transparent spacer TS. In an aspect of the present disclosure, frit sealing may be used to locally fuse frit powder at a high temperature with infrared ray laser and fusion bond the first substrate SUB1 and the second substrate SUB2. To this end, a glass material may be selected for the first substrate SUB1 and the second substrate SUB2.

The dam DAM may contain frit powder and a binder for fixing the frit powder to the first substrate SUB1 and the second substrate SUB2. The transparent spacer TS may be bonded to the first substrate SUB1 and the second substrate SUB2 by laser fusion bonding. The fusion-bonded frit powder has a lower moisture permeation rate and a lower air permeation rate than a UV-curable resin and thus may effectively block external moisture and oxygen.

It will be understood by a person with ordinary skill in the art that various changes and modifications may be applicable within a range not departing from the technical idea of the present disclosure. Accordingly, the technical scope of the present disclosure is not limited to the detailed description of the specification but should be defined by the accompanying claims.

What is claimed is:

1. A transparent display device, comprising:
 a display panel including first areas which are emission areas and second areas which are transmission areas, which transmit external light so that a user recognizes objects located on the rear surface of the transparent display device,
 wherein the display panel includes first and second substrates facing each other, and
 the first substrate includes an insulating layer having an open hole that is formed by removing the insulating layer by at least a partial thickness in the second area,
 the second substrate includes a transparent spacer located in the second area only and pulled into the open hole, and
 the first area includes an organic emission layer extended along both lateral sides of the transparent spacer.

2. The transparent display device according to claim 1, wherein the transparent spacer has a cross-section that includes:
 a first top side in contact with the second substrate;
 a first bottom side facing the first top side;
 a first right side connecting one side of the first top side and one side of the first bottom side; and
 a first left side connecting the other side of the first top side and the other side of the first bottom side, and
 wherein the open hole has a cross-section that includes:
 a second bottom side facing the first bottom side;
 a second right side extended from one end of the second bottom side and facing the first right side; and
 a second left side extended from the other end of the second bottom side and facing the first left side.

3. The transparent display device according to claim 2, wherein the first bottom side and the first right side form an internal angle to be a right angle or an obtuse angle, and
 wherein the second bottom side and the second right side form an internal angle corresponding to an internal angle formed by the first bottom side and the first right side.

4. The transparent display device according to claim 2, wherein the first bottom side and the first left side form an internal angle to be a right angle or an obtuse angle, and
 wherein the second bottom side and the second left side form an internal angle corresponding to an internal angle formed by the first bottom side and the first left side.

5. The transparent display device according to claim 1, wherein the first areas include a first sub-area and a second sub-area located adjacent to each other with the second area interposed therebetween, and the first substrate includes:
 a first sub-electrode disposed only in the first sub-area;
 a second sub-electrode disposed only in the second sub-area;
 an organic emission layer covering the first sub-electrode and the second sub-electrode and disposed and extended on the first sub-area, the second areas and the second sub-area; and
 a second electrode covering the organic emission layer and disposed and extended on the second sub-area, the first areas and the second sub-area.

6. The transparent display device according to claim 5, wherein a part of the organic emission layer and a part of the second electrode are disposed inside the open hole.

7. The transparent display device according to claim 5, wherein the open hole penetrates the insulating layer, and a part of the organic emission layer and a part of the second electrode are disposed inside the open hole.

8. The transparent display device according to claim 1, wherein, the first areas include a first sub-area and a second sub-area located adjacent to each other with the second area interposed therebetween, and the first substrate includes:
 a first sub-electrode disposed only in the first sub-area;
 a second sub-electrode disposed only in the second sub-area;
 a second electrode covering the organic emission layer and disposed and disposed on the first sub-area and the second sub-area,
 wherein the open hole penetrates the insulating layer and the organic emission layer and the second electrode are removed from the inside of the open hole to expose the first substrate, and
 wherein the organic emission layer covers the first sub-electrode and the second sub-electrode and disposed on the first sub-area and the second sub-area.

9. The transparent display device according to claim 8, wherein the transparent spacer is in direct contact with the first substrate inside the open hole.

10. The transparent display device according to claim 1, wherein the display panel includes pixels disposed in the first areas, and the transparent spacer is located between each pair of the pixels adjacent to each other.

11. The transparent display device according to claim 1, wherein the display panel includes pixels disposed in the first areas, and the transparent spacer is selectively located between the pixels adjacent to each other in a predetermined area only.

12. The transparent display device according to claim 1, wherein the display panel includes pixels disposed in the first areas, and the transparent spacer is located and extended as one body between a plurality of pairs of the pixels adjacent to each other.

13. The transparent display device according to claim 1, wherein the transparent spacer contains frit powder.

14. The transparent display device according to claim 1, further comprising a dam located on edges of the first substrate and the second substrate,
 wherein the dam contains frit powder.

15. The transparent display device according to claim 14, wherein the dam further contains a binder for fixing the frit powder to the first substrate and the second substrate.

16. A transparent display device, comprising:
 a display panel including emission areas and transmission areas which transmit external light so that a user recognizes objects located on the rear surface of the transparent display device,
 wherein the display panel includes a transistor array substrate and a color filter substrate facing each other,
 wherein the transistor array substrate includes an insulating layer having an open hole that is formed by removing at least a part of the insulating layer in the transmission areas,
 wherein the color filter substrate includes a transparent spacer located in the transmission areas only and accommodated in the open hole,
 wherein the shape of the transparent spacer corresponds to the shape of the open hole, and
 wherein the first area includes an organic emission layer extended along both lateral sides of the transparent spacer.

17. The transparent display device according to claim 16, wherein the transparent spacer have a shape protruding toward the transistor array substrate and at least a part of the transparent spacer is inserted into an inner space inside the open hole.

18. The transparent display device according to claim 16, wherein the transparent spacer is contact with the transistor array substrate inside the open hole.

19. The transparent display device according to claim 16, wherein the transparent spacer has a cross section that includes:
 a first top side in contact with the color filter substrate;
 a first bottom side facing the first top side;
 a first right side connecting one side of the first top side and one side of the first bottom side; and
 a first left side connecting the other side of the first top side and the other side of the first bottom side, and
 wherein the open hole has a cross-section that includes:
 a second bottom side facing the first bottom side;
 a second right side extended from one end of the second bottom side and facing the first right side; and
 a second left side extended from the other end of the second bottom side and facing the first left side.

20. The transparent display device according to claim 19, wherein the second bottom side and the second right side form an internal angle corresponding to an internal angle formed by the first bottom side and the first right side, and
 wherein the second bottom side and the second left side form an internal angle corresponding to an internal angle formed by the first bottom side and the first left side.

* * * * *